(12) United States Patent
Jung et al.

(10) Patent No.: US 11,955,157 B2
(45) Date of Patent: Apr. 9, 2024

(54) PHYSICALLY UNCLONABLE FUNCTION APPARATUS BASED ON FERROELECTRIC ELEMENTS AND OPERATION METHOD THEREOF

(71) Applicant: INDUSTRY-ACADEMIC COOPERATION FOUNDATION, YONSEI UNIVERSITY, Seoul (KR)

(72) Inventors: Seong Ook Jung, Seoul (KR); Se Hee Lim, Seoul (KR); Tae Woo Oh, Seoul (KR); Se Keon Kim, Seoul (KR); Dong Han Ko, Seoul (KR)

(73) Assignee: INDUSTRY-ACADEMIC CORPORATION FOUNDATION, YONSEI UNIVERSITY, Seoul (KR)

( * ) Notice: Subject to any disclaimer, the term of this patent is extended or adjusted under 35 U.S.C. 154(b) by 41 days.

(21) Appl. No.: 17/671,516

(22) Filed: Feb. 14, 2022

(65) Prior Publication Data
US 2022/0383927 A1 Dec. 1, 2022

(30) Foreign Application Priority Data
Feb. 18, 2021 (KR) .................. 10-2021-0021619

(51) Int. Cl.
 *G11C 11/22* (2006.01)
(52) U.S. Cl.
 CPC ........ *G11C 11/2295* (2013.01); *G11C 11/223* (2013.01); *G11C 11/2255* (2013.01); *G11C 11/2273* (2013.01)

(58) Field of Classification Search
CPC ............ G11C 11/2255; G11C 11/2295; G11C 11/2273; G11C 11/223
See application file for complete search history.

(56) References Cited

U.S. PATENT DOCUMENTS

| | | | | |
|---|---|---|---|---|
| 10,468,104 B1* | 11/2019 | Anand | ................. | H04L 9/3278 |
| 11,233,663 B1* | 1/2022 | Hoefler | ................. | H04L 9/0866 |
| 2016/0027490 A1 | 1/2016 | Müller | | |
| 2019/0019545 A1* | 1/2019 | Juvekar | ............... | G11C 11/2273 |
| 2019/0189768 A1 | 6/2019 | Liao et al. | | |
| 2019/0252016 A1* | 8/2019 | Rodriguez | ............ | H04L 9/0866 |

* cited by examiner

*Primary Examiner* — Tuan T Nguyen

(57) ABSTRACT

A PUF apparatus comprises: a PUF cell array in which a plurality of PUF cells are arranged each including a FeFET pair whose gates are commonly connected to a corresponding word line among a plurality of word lines, and whose drains and sources are connected to a corresponding bit line pair and a corresponding source line pair among a plurality of bit line pairs and a plurality of source line pairs running in a direction crossing the plurality of word lines; and a read-write-back block which is activated according to a read enable signal, and senses and amplifies a voltage difference occurring in a corresponding bit line pair among the plurality of bit line pairs according to the difference in driving strength due to a deviation in a manufacturing process of the FeFET pair in the PUF cell selected by a selected word line among the plurality of word lines.

11 Claims, 11 Drawing Sheets

PHYSICALLY UNCLONABLE FUNCTION APPARATUS BASED ON FERROELECTRIC ELEMENTS AND OPERATION METHOD THEREOF

CROSS-REFERENCE TO RELATED APPLICATIONS

This application claims priority under 35 U.S.C. § 119(a) to Korean Patent Application No. 10-2021-0021619, filed on Feb. 18, 2021, in the Korean Intellectual Property Office, the disclosure of which is incorporated herein in its entirety by reference.

BACKGROUND

1. Technical Field

The present disclosure relates to a PUF apparatus and an operation method thereof, more particularly to a PUF apparatus based on ferroelectric elements and an operation method thereof.

2. Description of the Related Art

PUF (Physically Unclonable Function) refers to a security technique using the characteristic that physical deviations such as line delay and gate delay exist in circuits manufactured by minute process variations that inevitably occur in the process, even when manufacturing circuits under the same design and according to the same manufacturing process.

Accordingly, even when the same input is applied, the PUF apparatus may output an output key randomly determined by a physical deviation according to a manufacturing process situation. At this time, since the output key determined according to the process situation cannot be predicted even by the circuit designer, the PUF apparatus can provide a high security level, and therefore is being applied to various apparatuses requiring security.

The PUF apparatus is configured to, when an input called a challenge is applied, output an output key called a response corresponding to the applied challenge. In addition, in the authentication server that verifies the security of the PUF apparatus, a plurality of challenge-response pairs (CRPs) are pre-stored in which a plurality of challenges for the corresponding PUF apparatus and a response corresponding to each challenge are matched in pairs. Accordingly, the authentication server for authenticating the PUF apparatus performs authentication on the PUF apparatus that transmitted the response, by transmitting a challenge to the PUF apparatus, and determining whether the response replied from the PUF apparatus conforms to the pre-stored CRP.

In conventional encryption apparatuses, in general, as a method of storing a random number generated by using a random number generator (hereinafter referred to as RNG) in a non-volatile memory is used, a circuit for generating a password and a circuit for storing the generated password must be separately provided. In addition, there was a problem in that the manufacturing cost increases as a high level of security is required to prevent the password from being leaked out in the process of transmitting the password generated in the RNG to the non-volatile memory. However, in the case of using a PUF apparatus, since a password is generated and stored at the same time, it has the advantage of being more advantageous for security as well as cost reduction.

Important factors in designing a PUF apparatus include randomness, independence and stability. Among them, randomness means that the response to each challenge should be random, independence means that responses generated in the same PUF apparatus should be independent of each other, and stability means that the response to the same challenge should be the same irrespective of changes in environmental conditions.

Meanwhile, with the recent development of the Internet of Thing (hereinafter, referred to as IoT), the importance of security of various IoT devices is emerging, and the demand for PUF apparatuses is accordingly increasing. Since many IoT devices are manufactured as small and low power consumption devices, randomness, independence and stability, area efficiency, and low power operation are essential for PUF apparatuses applied to IoT devices.

As a conventional PUF apparatus, a memory PUF that generates a random response using a memory structure has been mainly used. In the memory PUF, similar to a memory cell, a plurality of PUF cells are arranged in an array structure, and an address for the PUF cell is applied as a challenge. Accordingly, the memory PUF may select a PUF cell corresponding to an address applied as a challenge, and output a value stored or generated in the selected PUF cell as a response.

Representative memory PUFs include a static RAM (SRAM) PUF, a magnetoresistive RAM (MRAM) PUF, and a resistive RAM (RRAM) PUF, etc. In the SRAM PUF, each PUF cell is configured in the form of an SRAM latch containing 6 transistors, generates and maintains a response based on a process variation between two NMOS transistors and two PMOS transistors of the same polarity among the six transistors. Since each PUF cell has six transistors, SRAM not only requires a large area, but as a volatile memory, it has a limitation in that it has low stability due to variations according to environmental factors such as temperature or supply voltage.

In the MRAM PUF, the PUF cell is composed of two non-volatile MTJs (Magnetic Tunnel Junction) and two transistors, and generates a response based on the deviation of the resistance values of the two MTJs. Although MRAM PUF requires a smaller area than SRAM PUF and has high stability, a write-back circuit is additionally required such that the generated response is stably stored in the two MTJs, and the low on/off ratio of the MTJ is a factor that inhibits stability. Moreover, there is a problem in that energy consumption due to a static current is large.

In the RRAM PUF, similar to MRAM PUF, the PUF cell is composed of two non-volatile resistors and two transistors and generates a response based on the deviation of the resistance values of the two resistors, however like the MRAM PUF, a separate write-back circuit is required, and there is a limitation in that a mirroring current flows in order to use a sense amplifier and the energy consumption is therefore large.

SUMMARY OF THE INVENTION

An object of the present disclosure is to provide a PUF apparatus capable of improving stability by using a ferroelectric element, which is a non-volatile memory having a high on/off ratio, and an operation method thereof.

Another object of the present disclosure is to provide a PUF apparatus that can be implemented in a compact size and reduce power consumption, and an operation method thereof.

A PUF apparatus according to an embodiment of the present disclosure, conceived to achieve the objectives above, comprises: a PUF cell array in which a plurality of PUF cells are arranged each including a FeFET pair whose gates are commonly connected to a corresponding word line among a plurality of word lines, and whose drains and sources are respectively connected to a corresponding bit line pair and a corresponding source line pair among a plurality of bit line pairs and a plurality of source line pairs running in a direction crossing the plurality of word lines; and a read-write-back block which is activated according to a read enable signal, and senses and amplifies a voltage difference occurring in a corresponding bit line pair among the plurality of bit line pairs according to the difference in driving strength due to a deviation in a manufacturing process of the FeFET pair included in the PUF cell selected by a selected word line among the plurality of word lines.

The read-write-back block may include: an amplifying block having a plurality of first sense amplifiers which are disposed between the plurality of bit line pairs and a voltage line, respectively, and which cross-sense the corresponding bit line pair and amplify the voltage difference between the corresponding bit line pair; and a write-back block having a plurality of second sense amplifiers which are disposed between the plurality of source line pairs and a ground line, respectively, and which are activated according to a read enable signal, cross-sense the corresponding bit line pair and generate a voltage difference in the corresponding source line pair.

Each of the plurality of first sense amplifiers may include: a first pull-up transistor which is connected between a bit line of a corresponding bit line pair and the voltage line, and a gate of which is connected to a bit line bar; and a second pull-up transistor which is connected between a bit line bar of a corresponding bit line pair and the voltage line, and a gate of which is connected to a bit line.

Each of the plurality of second sense amplifiers may include: a first activation transistor, one end of which is connected to a source line of a corresponding source line pair, and having a gate to which the read enable signal is applied; a second activation transistor, one end of which is connected to a source line bar of a corresponding source line pair, and having a gate to which the read enable signal is applied; a first pull-down transistor, which is connected between the other end of the first activation transistor and the ground line, and having a gate to which a bit line bar of a corresponding bit line pair is connected; and a second pull-down transistor, which is connected between the other end of the second activation transistor and the ground line, and having a gate to which a bit line of a corresponding bit line pair is connected.

The PUF apparatus may further include: a precharge block having a plurality of column precharge blocks which are connected in parallel to a corresponding first sense amplifier between a corresponding bit line pair among the plurality of bit line pairs and the voltage line, and which supply a voltage applied to the voltage line to a corresponding bit line pair according to an inactivated read enable signal; and an initialization block having a plurality of column initialization blocks which are connected in parallel with a corresponding second sense amplifier between a corresponding source line pair among the plurality of source line pairs and the ground line, and which supply a voltage applied to the ground line to a corresponding source line pair according to an inactivated inverted initialization signal.

Each of the plurality of column precharge blocks may include: a first transmission gate which is connected between a bit line of a corresponding bit line pair and the voltage line, and which supplies the voltage of the voltage line to the bit line, according to the inactivated read enable signal and an inverted read enable signal in which the read enable signal is inverted; and a second transmission gate which is connected between a bit line bar of a corresponding bit line pair and the voltage line, and which supplies the voltage of the voltage line to the bit line bar, according to the inactivated read enable signal and the inverted read enable signal.

Each of the plurality of column initialization blocks may include: a first initialization transistor which is connected between a source line of a corresponding source line pair and the ground line, and which supplies the voltage of the ground line to the source line according to the inactivated inverted initialization signal; and a second initialization transistor which is connected between a source line bar of a corresponding source line pair and the ground line, and which supplies the voltage of the ground line to the source line bar according to the inactivated inverted initialization signal.

In the PUF cell array, in the PUF apparatus implemented as a semiconductor chip, a source and a drain of a FeFET pair of a plurality of PUF cells in the same column may be alternately arranged in reverse, such that one of the source and the drain is shared in a FeFET pair of adjacent PUF cells among the plurality of PUF cells in the same column connected to the same bit line pair and the same source line pair.

An operation method of a PUF apparatus according to another embodiment of the present disclosure, conceived to achieve the objectives above, the PUF apparatus comprising a PUF cell array in which a plurality of PUF cells are arranged each including a FeFET pair whose gates are commonly connected to a corresponding word line among a plurality of word lines, and whose drains and sources are respectively connected to a corresponding bit line pair and a corresponding source line pair among a plurality of bit line pairs and a plurality of source line pairs running in a direction crossing the plurality of word lines, comprises an enrollment phase of sequentially selecting one of the plurality of word lines by changing challenges indicating addresses of the plurality of PUF cells, making the FeFET pair of the PUF cell corresponding to the selected word line have different threshold voltage states according to variations in the manufacturing process, and accordingly, setting a response corresponding to each of the challenges.

The enrollment phase may include: an initialization phase of applying a pre-designated first voltage to gates of FeFET pairs of the plurality of PUF cells, applying a second voltage of a higher voltage level than the first voltage to sources and drains, and initializing each FeFET pair of the plurality of PUF cells to have the same pre-designated threshold voltage state; an enrollment precharge phase of precharging the plurality of bit line pairs to a third voltage between the first voltage and the second voltage, and floating the plurality of source line pairs; and a provisioning and write-back phase of applying the first voltage to the source line pair, and, in order that the FeFET pair of the PUF cell corresponding to the selected word line among the plurality of PUF cells senses voltage differences between the plurality of bit line pairs that occurs according to a deviation in a manufacturing process, and at the same time, the FeFET pair of the corresponding PUF cell have different threshold voltage states, amplifying the sensed voltage differences between the bit line pairs and performing write-back.

Accordingly, the PUF apparatus and operation method thereof, according to an embodiment of the present disclosure, can have high stability by constructing a PUF cell based on a ferroelectric element, which is a non-volatile memory with a high on/off ratio, and since the PUF cell is composed of two FeFETs and the response generated in the PUF cell is amplified at the same time while being generated, and written-back to the PUF cell, a separate write-back circuit is not required, so that it can be manufactured in a compact size. In addition, it is possible to minimize the static current according to the state of the FeFET, thereby reducing energy consumption.

DETAILED DESCRIPTION OF THE INVENTION

Figure 1:
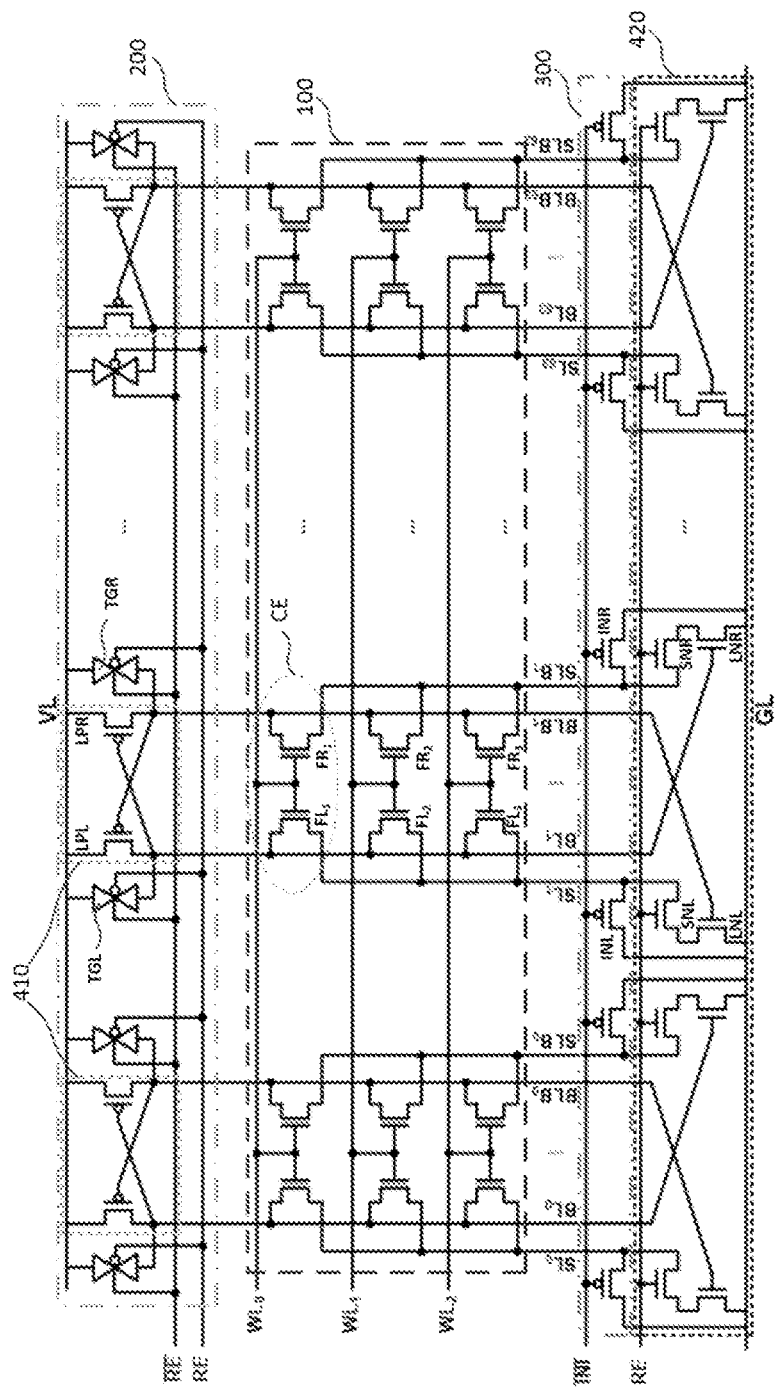
FIG. 1 shows an example of a PUF apparatus according to an embodiment of the present disclosure.

In order to fully understand the present disclosure, operational advantages of the present disclosure, and objects achieved by implementing the present disclosure, reference should be made to the accompanying drawings illustrating preferred embodiments of the present disclosure and to the contents described in the accompanying drawings.

Hereinafter, the present disclosure will be described in detail by describing preferred embodiments of the present disclosure with reference to accompanying drawings. However, the present disclosure can be implemented in various different forms and is not limited to the embodiments described herein. For a clearer understanding of the present disclosure, parts that are not of great relevance to the present disclosure have been omitted from the drawings, and like reference numerals in the drawings are used to represent like elements throughout the specification.

Throughout the specification, reference to a part "including" or "comprising" an element does not preclude the existence of one or more other elements and can mean other elements are further included, unless there is specific mention to the contrary. Also, terms such as "unit", "device", "module", "block", and the like described in the specification refer to units for processing at least one function or operation, which may be implemented by hardware, software, or a combination of hardware and software.

Figure 2:
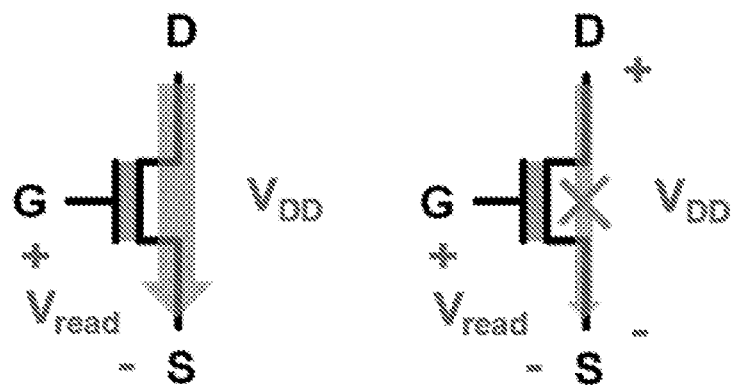
FIG. 2 is a diagram for explaining characteristics of FeFET, which is a ferroelectric element.
Figure 3:
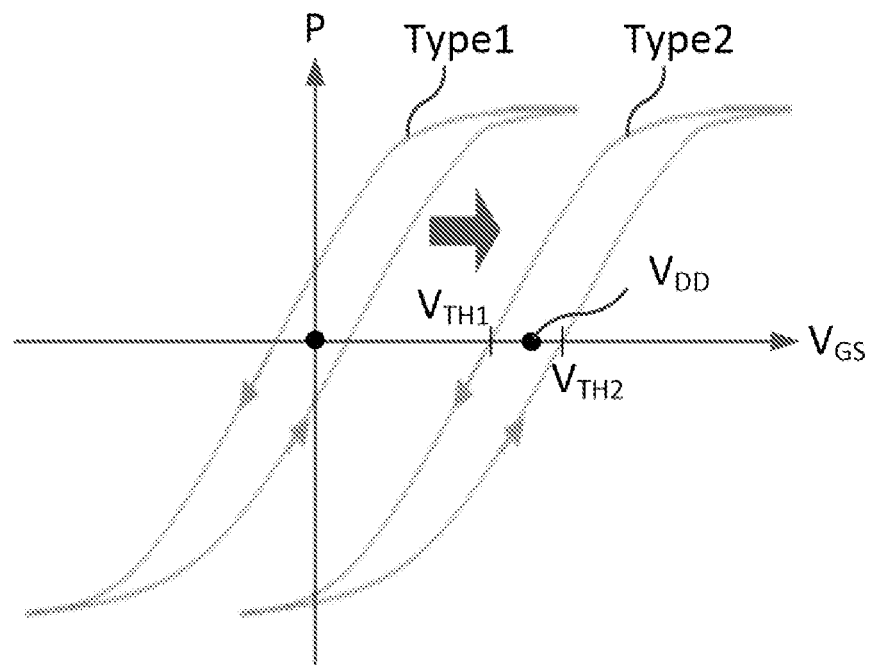
FIG. 3 shows hysteresis characteristics of the FeFET of FIG. 2.

FIG. 1 shows an example of a PUF apparatus according to an embodiment of the present disclosure, FIG. 2 is a diagram for explaining characteristics of FeFET, which is a ferroelectric element, and FIG. 3 shows hysteresis characteristics of the FeFET of FIG. 2.

Referring to FIG. 1, the PUF apparatus according to the present embodiment includes a PUF cell array 100 in which a plurality of PUF cells (CE) are arranged which are defined by a plurality of word lines (WL), and a plurality of bit line pairs (BL, BLB) and a plurality of source line pairs (SL, SLB) running in a direction crossing the plurality of word lines (WL), each PUF cell being implemented as a FeFET pair (FL, FR), a precharge block 200 precharging the plurality of bit line pairs (BL, BLB) to a pre-designated voltage level according to a read enable signal (RE), an initialization block 300 supplying a pre-designated voltage to a plurality of source line pairs (SL, SLB) in order to initialize the state of a plurality of PUF cells (CE) to a pre-designated initial state according to an inverted initialization signal ($\overline{INI}$), and a read-write-back block amplifying a response generated in the selected PUF cell among the plurality of PUF cells and storing the amplified response in the selected PUF cell.

First, the PUF cell array 100 includes a plurality of PUF cells (CE) disposed at positions where one word line (WL) intersect one bit line pair (BL, BLB) and one source line pair (SL, SLB), and each of the plurality of PUF cells (CE) includes two FeFETs(Ferroelectric FET) (FL={FL$_1$, FL$_2$, FL$_3$, ... }, FR={FR$_1$, FR$_2$, FR$_3$, ... }) that are ferroelectric elements, respectively. That is, in the PUF apparatus according to the present embodiment, each of the plurality of PUF cells (CE) includes only two FeFETs (FL, FR). Accordingly, the size of the PUF cell (CE) can be significantly reduced compared to the conventional memory PUF apparatus.

Here, as an example, it is assumed that the plurality of word lines (WL) run in the row direction, and the plurality of bit line pairs (BL, BLB) and the plurality of source line pairs (SL, SLB) run in the column direction. Accordingly, the plurality of PUF cells (CE) respectively disposed at positions where one word line (WL) intersect one bit line pair (BL, BLB) and one source line pair (SL, SLB) may be arranged in a matrix structure.

A FeFET pair (FL, FR) of each PUF cell (CE) has gates connected in common to the corresponding word line (WL), a first FeFET (FL) has a source and a drain connected to the corresponding source line (SL) and the bit line (BL), respectively, and a second FeFET (FR) has a source and a drain connected to the corresponding source line bar (SLB) and the bit line bar (BLB), respectively. In the PUF cell array 100, PUF cells (CE) arranged in the same column among the plurality of PUF cells (CE) are commonly connected to a bit line pair (BL, BLB) and a source line pair (SL, SLB).

As shown in FIG. 2, each of the first and second FeFETs (FL, FR), like MOSFET, has a three-terminal structure of source-gate-drain, in which a ferroelectric layer is added between the gate and the oxide layer. And, as shown in FIG. 3, in the FeFET, the threshold voltage ($V_{TH}$) varies according to the gate-source voltage ($V_{GS}$) according to the hysteresis characteristic of the ferroelectric. Accordingly, 1-bit data can be stored using the variable threshold voltage ($V_{TH}$). In general, a state having the first threshold voltage ($V_{TH1}$) of a relatively low voltage level among the variable threshold voltages ($V_{TH}$) in the FeFET may be designated as a low threshold voltage state (LVT) to store Logic 1, and a state having the second threshold voltage ($V_{TH2}$) of a relatively high voltage level may be designated as a high threshold voltage state (HVT) to store Logic 0.

Meanwhile, the pattern of the hysteresis curve of FeFETs (FL, FR) can be variously modified through structural change or composition change or the like, as well as addition of a metal layer inside the gate electrode structure or the ferroelectric layer. Accordingly, in the present embodiment, as shown in FIG. 3, it is assumed that an FeFET of the second type (Type2) is used in which the first threshold voltage (Van) of a relatively low voltage level in the hysteresis curve of the FeFET is shifted in the positive voltage direction such that it becomes a positive voltage level ($V_{TH1}>0$). Therefore, in the second type of FeFET, both the first threshold voltage ($V_{TH1}$) and the second threshold voltage ($V_{TH2}$) can have positive voltage levels (here, 0.68V and 1.58V, for example).

FeFETs (FL, FR) have advantages in that they have excellent compatibility with CMOS circuits, and show superior performance with high ON/OFF ratio ($10^{15}$), fast write speed (10 ns) and low write power consumption, compared to other non-volatile memories.

The precharge block 200 precharges a plurality of bit line pairs (BL, BLB) to a pre-designated voltage level according to a read enable signal pair (RE, $\overline{RE}$) in an initialization phase and a precharge phase to be described later. The precharge block 200 is activated according to the read enable signal pair (RE, $\overline{RE}$), which is a pair of a read enable signal (RE) and an inverted read enable signal ($\overline{RE}$). In particular, when the read enable signal (RE) is inactivated and the inverted read enable signal ($\overline{RE}$) is accordingly activated, the precharge block 200 is activated and precharges a plurality of bit line pairs (BL, BLB).

In this embodiment, the precharge block 200 is connected between the voltage line (VL) and the plurality of bit line pairs (BL, BLB), and may precharge the plurality of bit line pairs (BL, BLB) by applying a voltage applied to the voltage line (VL) according to the read enable signal pair (RE, $\overline{RE}$) to the plurality of bit line pairs (BL, BLB).

The precharge block 200 may include a plurality of column precharge blocks which are provided corresponding to each of the plurality of bit line pairs (BL, BLB), and supply a pre-designated voltage to the corresponding bit line pairs (BL, BLB), respectively. Each of the plurality of column precharge blocks includes two transmission gates (TGL, TGR) which are connected between the voltage line (VL) and each of the corresponding bit line pairs (BL, BLB) and supply a voltage applied to the voltage line (VL) according to the read enable signal pair (RE, $\overline{RE}$) to the bit line pair (BL, BLB).

The first transmission gate (TGL) is connected between the voltage line (VL) and the corresponding bit line (BL), and the second transmission gate (TGR) is connected between the voltage line (VL) and the corresponding bit line bar (BLB), thereby applying the voltage of the voltage line (VL) to each of the bit line (BL) and the bit line bar (BLB) according to the voltage level of the read enable signal pair (RE, $\overline{RE}$).

The initialization block 300 is connected between the plurality of source line pairs (SL, SLB) and the ground line (GL), activated according to the inverted initialization signal ($\overline{INI}$), which is inactivated in the initialization phase to be described later, and connects the source line pair (SL, SLB) and the ground line (GL). The initialization block 300 may include a plurality of column initialization blocks respectively corresponding to the plurality of source line pairs (SL, SLB). Each of the plurality of column initialization blocks include two initialization transistors (INL, INR) which are connected between each of the corresponding source line pair (SL, SLB) and the ground line (GL) and turned on according to the inactivated inverted initialization signal ($\overline{INI}$), thereby connecting the source line pair (SL, SLB) to the ground line (GL). The two initialization transistors (INL, INR) may be implemented as PMOS transistors.

An inverted initialization signal ($\overline{INI}$) is applied to the gates of the two initialization transistors (INL, INR). A first initialization transistor (INL) of the two initialization transistors (INL, INR) is connected between a corresponding source line (SL) and the ground line (GL), and a second initialization transistor (INR) is connected between a corresponding source line bar (SLB) and the ground line (GL).

Meanwhile, the read-write-back block is activated according to a read enable signal (RE), senses and amplifies a response generated in the selected PUF cell among a plurality of PUF cells (CE) by receiving through the bit line pair (BL, BLB), and applies the amplified response back to the selected PUF cell through the source line pair (SL, SLB), so that the response is written-back to the selected PUF cell.

The read-write-back block may include an amplifying block 410 which is disposed between the voltage line (VL) and the PUF cell array 100, transmits the voltage applied to the voltage line (VL) to the bit line pair (BL, BLB) of the PUF cell array 100, and amplifies the voltage difference of the bit line pair (BL, BLB) generated according to the threshold voltage deviation of the FeFET pair (FL, FR) of the PUF cell array 100, and a write-back block 420 which is disposed between the PUF cell array 100 and the ground line (GL), activated according to an activated read enable signal (RE), senses the voltage difference between the bit line pair (BL, BLB) and controls the current flowing through the source line pair (SL, SLB) and the ground line (GL).

The amplifying block 410 may include a plurality of first sense amplifiers respectively corresponding to the plurality of bit line pairs (BL, BLB), and the write-back block 420 may include a plurality of second sense amplifiers respectively corresponding to the plurality of bit line pairs (BL, BLB) and the plurality of source line pairs (SL, SLB). Accordingly, each of the plurality of first sense amplifiers is connected in parallel with a corresponding column precharge block among the plurality of column precharge blocks, and each of the plurality of second sense amplifiers is connected in parallel to a corresponding plurality of column initialization blocks among the plurality of column initialization blocks.

Here, the first sense amplifier includes two pull-up transistors (LPL, LPR) connected between the voltage line (VL) and each of the corresponding bit line pair (BL, BLB). The two pull-up transistors (LPL, LPR) may be implemented as PMOS transistors. The first pull-up transistor (LPL) is connected between the voltage line (VL) and the corresponding bit line (BL), and its gate is connected to the bit line bar (BLB). The second pull-up transistor (LPR) is connected between the voltage line (VL) and the corresponding bit line bar (BLB), and its gate is connected to the bit line (BL). That is, the first pull-up transistor (LPL) is connected in parallel with the first transmission gate (TGL), and the second pull-up transistor (LPR) is connected in parallel with the second transmission gate (TGR), wherein the gates cross each other and are connected to the bit line pair (BL, BLB).

The second sense amplifier includes four NMOS transistors (SNL, SNR, LNL, LNR) connected between each of the corresponding source line pair (SL, SLB) and the ground line (GL). A first activation transistor (SNL) and a first pull-down transistor (LNL) are connected in series between the source line (SL) and the ground line (GL), and a second activation transistor (SNR) and a second pull-down transistor (LNR) are connected in series between the source line bar (SLB) and the ground line (GL). An enable signal (RE) is applied to the gates of the first and second activation transistors (SNL, SNR), the gate of the first pull-down transistor (LNL) is connected to the bit line bar (BLB), and the gate of the second pull-down transistor (LNR) is connected to the bit line (BL). That is, the gates of the first and second pull-down transistors (LNL, LNR) are cross-connected to the bit line pair (BL, BLB).

In the second sense amplifier, the first and second pull-down transistors (LNL, LNR) are connected to the source line pair (SL, SLB) only when the first and second activation transistors (SNL, SNR) are turned on according to the enable signal (RE), and selectively connect the source line pair (SL, SLB) to the ground line (GL) according to a voltage difference between the bit line pair (BL, BLB).

An operation of the PUF apparatus having the above-described configuration may include an enrollment phase for obtaining CRP and an evaluation phase for outputting a response corresponding to an input challenge. The enrollment phase is performed once before actually operating the PUF apparatus to obtain CRP, and the obtained CRP may be stored in the authentication server. The evaluation phase is a phase for outputting a response corresponding to the challenge applied when actually operating the PUF apparatus, and for example, it may be configured, when an address for a specific PUF cell (CE) of the PUF cell array 100 is applied from the authentication server, to obtain a response stored in the PUF cell (CE) according to the applied address and transmit it to the authentication server.

Figure 4:
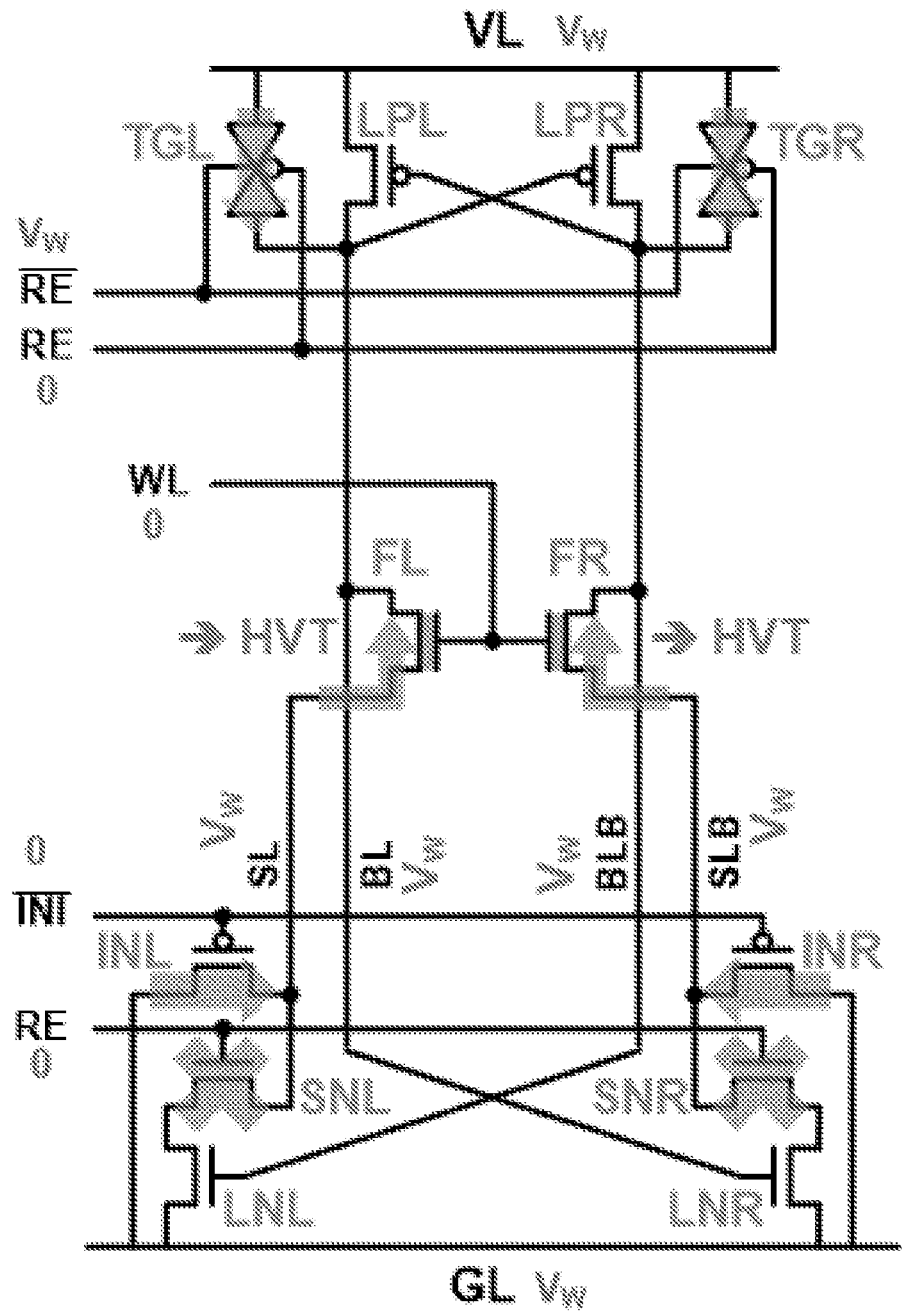
FIGS. 4 to 6 are diagrams for explaining operations of the enrollment phase of the PUF apparatus according to the present embodiment.
Figure 5:
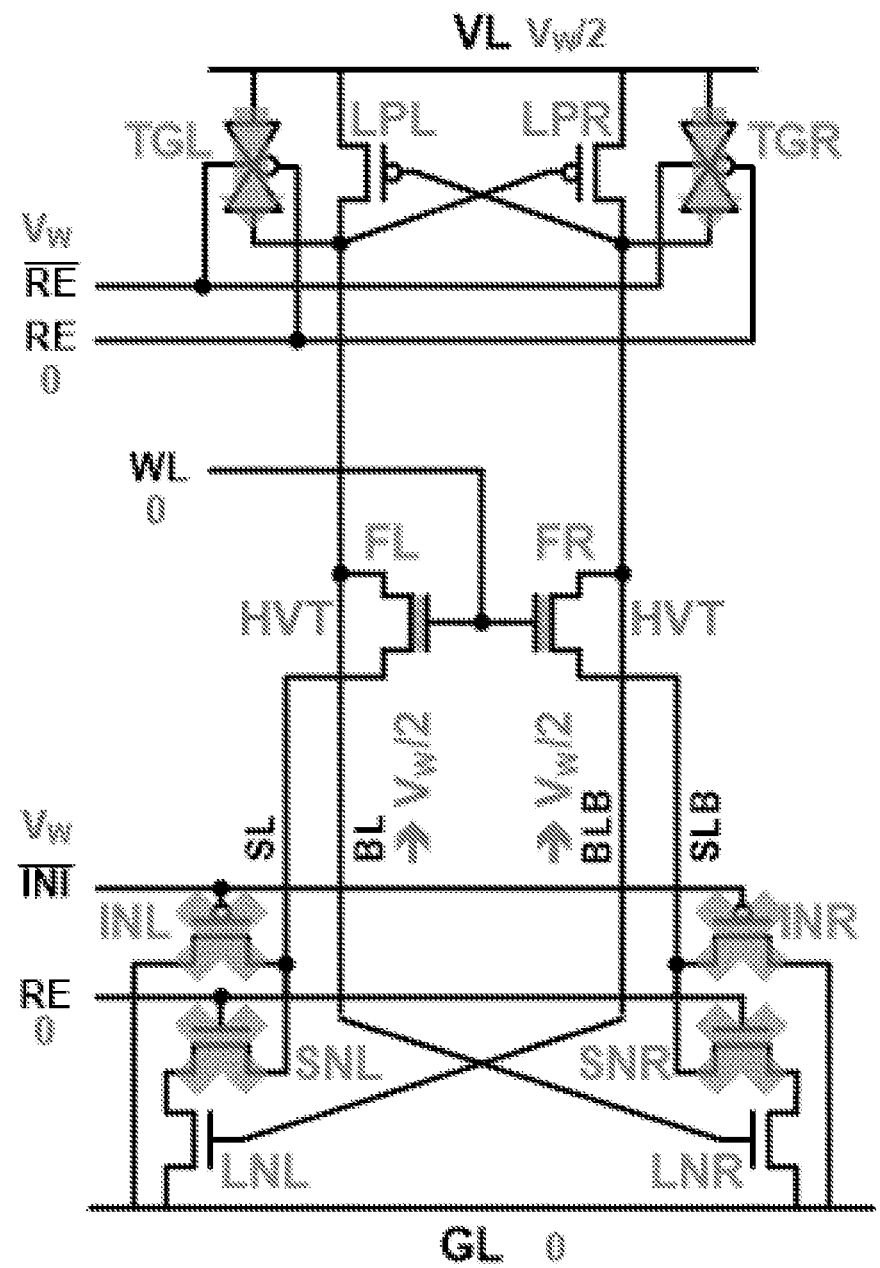
Figure 6:
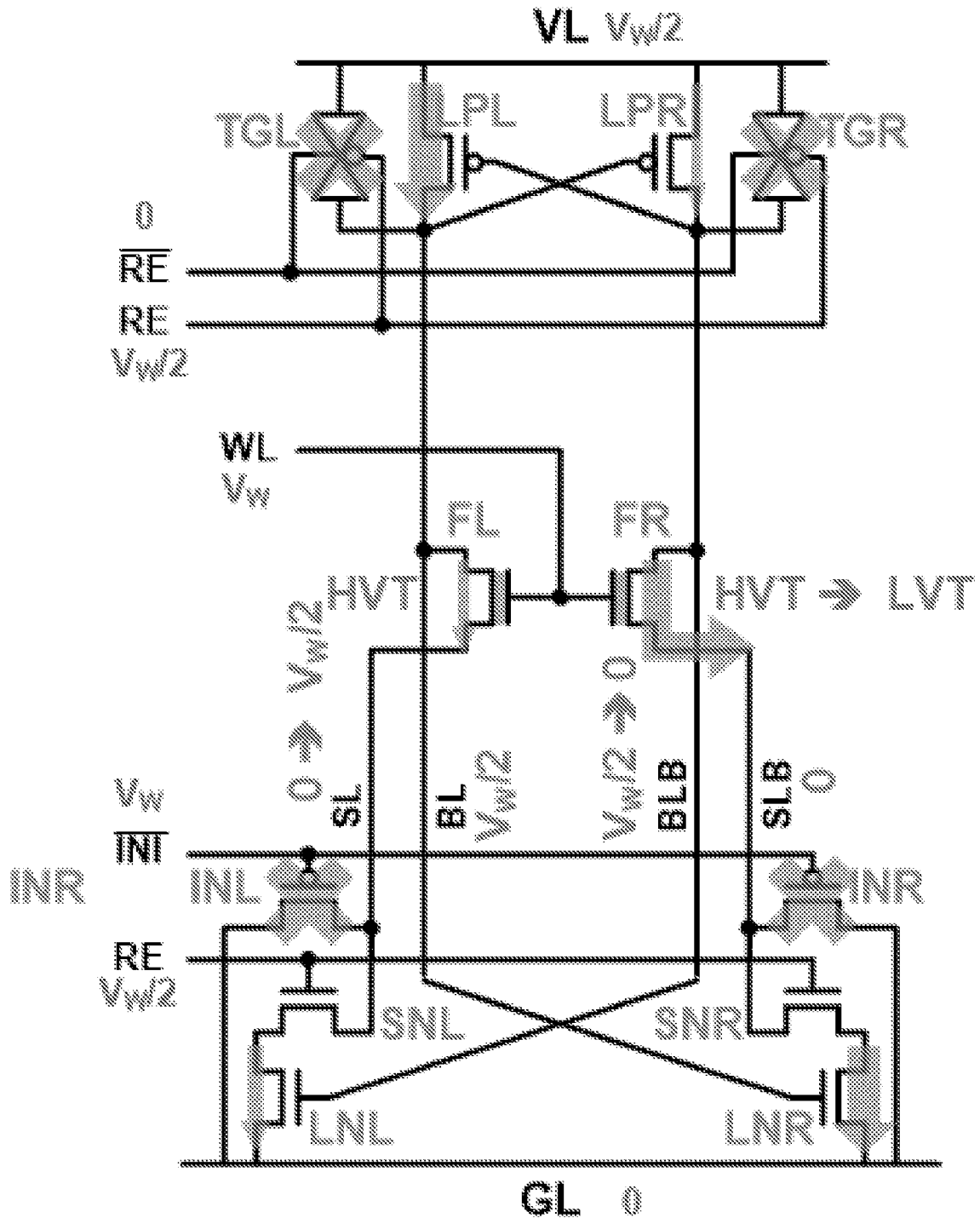
Figure 7:
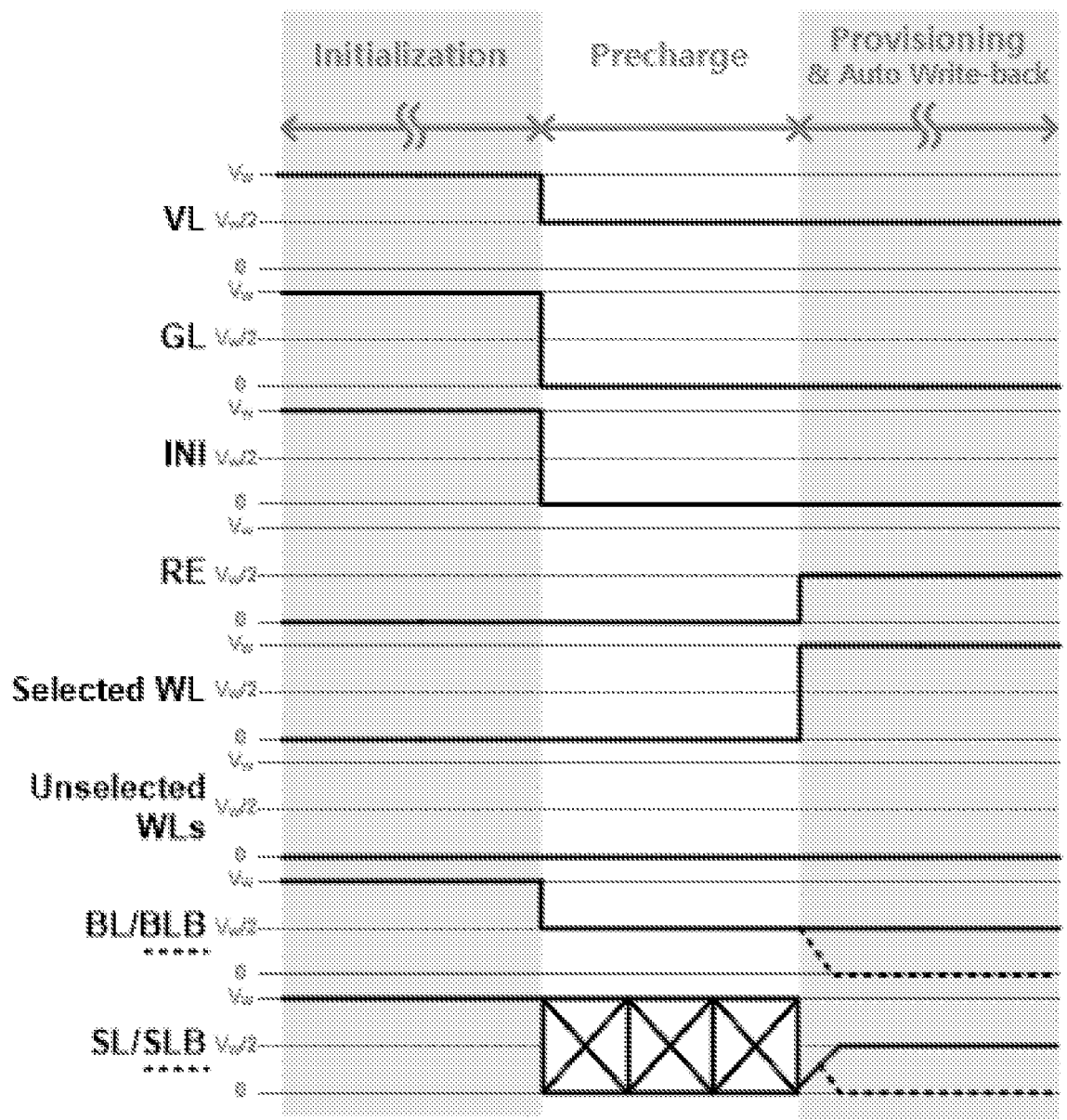
FIG. 7 shows a timing diagram for the enrollment phase shown in FIGS. 4 to 6.

FIGS. 4 to 6 are diagrams for explaining operations of the enrollment phase of the PUF apparatus according to the present embodiment, and FIG. 7 shows a timing diagram for the enrollment phase shown in FIGS. 4 to 6.

The enrollment phase of the PUF apparatus can be divided into sub-phases of an initialization phase shown in FIG. 4, a precharge phase shown in FIG. 5, a provisioning phase and an auto write-back phase shown in FIG. 6.

Referring to FIG. 4 and FIG. 7, in the initialization phase, all of the plurality of word lines (WL) are inactivated by applying a pre-designated first voltage (here, 0V as an example) level thereto, and the inverted initialization signal ($\overline{INI}$) is activated to the first voltage level, while the read enable signal (RE) and the inverted read enable signal ($\overline{RE}$) are inactivated to the first voltage level and a second voltage ($V_W$) level, respectively. A second voltage ($V_W$) of a pre-designated level is applied to the voltage line (VL) and the ground line (GL). Here, the second voltage ($V_W$) is a voltage which has a higher voltage level than the first voltage by a pre-designated voltage (e.g., 4V) so that it is possible to write data to the FeFET (FL, FR) of the PUF cell (CE), that is, to change the state of the FeFET (FL, FR).

Since all of the word lines (WL) are inactivated to the first voltage level, the first voltage level is applied to the gates of the FeFET pair (FL, FR) of the PUF cell (CE). In addition, the two initialization transistors (INL, INR) of the initialization block 300 are turned on according to the inverted initialization signal ($\overline{INI}$) of the first voltage level applied to the gate, transmit the second voltage ($V_W$) applied to the ground line (GL) to the sources of the FeFET pairs (FL, FR) of all PUF cells (CE) through the source line pair (SL, SLB). Accordingly, a gate-source voltage ($V_{GS}$) corresponding to a negative second voltage ($V_W$) is applied to the FeFET pairs (FL, FR) of all PUF cells (CE), and, as a result, the threshold voltage ($V_{TH}$) becomes the second threshold voltage ($V_{TH2}$) of a relatively high voltage level, so that all FeFET pairs (FL, FR) are initialized to the high threshold voltage state (HVT).

At this time, the precharge block 200 is activated by the inactivated read enable signal pair (RE, $\overline{RE}$), and transmits the second voltage ($V_W$) applied to the voltage line (VL) to the gates of the FeFET pairs (FL, FR) of all PUF cells (CE) through the bit line pairs (BL, BLB). In addition, as the bit line pairs (BL, BLB) transition to the second voltage ($V_W$) level through the precharge block 200, the two pull-up transistors (LPL, LPR) in the amplifying block 410 of the read-write-back block are turned off.

Since the second voltage ($V_W$) of the same level is also being applied to the sources of the FeFET pair (FL, FR) by the two initialization transistors (INL, INR) turned on of the initialization block 300, the voltage applied to the bit line pair (BL, BLB) is not applied to the source line pair (SL, SLB).

In addition, since in the write-back block 420 of the read-write-back block, the two activation transistors (SNL, SNR) are inactivated according to the enable signal (RE), the connections between the source line pair (SL, SLB) and the ground line (GL) are cut off. That is, the read-write-back block blocks the connections between the voltage line (VL) and the bit line pair (BL, BLB) and between the source line pair (SL, SLB) and the ground line (GL) during the initialization period, so that the threshold voltage deviation of the FeFET pair (FL, FR) of the PUF cell (CE) is not sensed and amplified, and all are initialized to the high threshold voltage state (HVT).

Here, the initialization phase should be maintained for a pre-designated write time ($t_W$) or longer such that the FeFET pair (FL, FR) of the PUF cell (CE) are stably brought to the high threshold voltage state (HVT).

Meanwhile, referring to FIG. 5 and FIG. 7, in the precharge phase, all of the plurality of word lines (WL) are maintained in an inactive state by applying the first voltage level thereto, and the read enable signal (RE) and the inverted read enable signal ($\overline{RE}$) are also inactivated and maintained to the first voltage level and the second voltage ($V_W$) level, respectively. However, the inverted initialization signal ($\overline{INI}$) transitions from the first voltage level to the second voltage ($V_W$) level and is inactivated, a third voltage ($V_W/2$) level is applied to the voltage line (VL), and the first voltage level is applied to the ground line (GL). That is, the voltage line (VL) and the ground line (GL) transition from the second voltage ($V_W$) level to the third voltage ($V_W/2$) level and the first voltage level, respectively.

As the inverted initialization signal ($\overline{INI}$) is inactivated to the second voltage ($V_W$) level, the two initialization transistors (INL, INR) of the initialization block 300 are turned off, and as the two activation transistors (SNL, SNR) of the write-back block 420 are inactivated by the read enable signal (RE), the connection between the source line pair (SL, SLB) and the ground line (GL) is cut off. In addition, the precharge block 200 transmits the third voltage ($V_W/2$) applied to the voltage line (VL) to the bit line pair (BL, BLB) according to the read enable signal pair (RE, $\overline{RE}$), thereby precharging the bit line pair (BL, BLB) to the third voltage ($V_W/2$). At this time, in the amplifying block 410 of the read-write-back block, gates of the two pull-up transistors (LPL, LPR) of the first sense amplifier are cross-connected to the bit line pair (BL, BLB) precharged with the third voltage ($V_W/2$), so the two pull-up transistors (LPL, LPR) are maintained in a turned-off state.

Meanwhile, the first voltage is applied to the gates of the FeFET (FL, FR) of the PUF cell (CE), and accordingly the FeFET (FL, FR) of the PUF cell (CE) maintain a turn-off state in the high threshold voltage state (HVT), so that the connection between the source line pair (SL, SLB) and the precharged bit line pair (BL, BLB) is cut off. In addition, in the write-back block 420, the two activation transistors (SNL, SNR) of the second sense amplifier maintain a turned-off state according to the inactivated enable signal (RE), so that the connection between the source line pair (SL, SLB) and the ground line (GL) is cut off. Accordingly, in the precharge phase, the source line pair (SL, SLB) is in a floating state.

At this time, even if the phase performed before the precharge phase is not an initialization phase, the two pull-up transistors (LPL, LPR) precharge the voltage level of the bit line pair (BL, BLB) to the third voltage ($V_W/2$) level of the voltage line (VL).

Referring to FIG. 6 and FIG. 7, in the provisioning phase, one word line (here, $WL_0$ as an example) is selected among the plurality of word lines (WL), a second voltage ($V_W$) is applied to the selected word line ($WL_0$), and a first voltage level is applied to the remaining word lines (not shown). The inverted initialization signal ($\overline{INI}$) is maintained at the second voltage ($V_W$) level. The read enable signal (RE) and the inverted read enable signal ($\overline{RE}$) transition to the third voltage ($V_W/2$) level and the first voltage level, respectively, and are activated. In addition, to the voltage line (VL), the third voltage ($V_W/2$) level is applied, and to the ground line (GL), the first voltage level is applied and maintained.

As the inverted initialization signal ($\overline{INI}$) is maintained at the second voltage ($V_W$) level, the two initialization transistors (INL, INR) of the initialization block 300 are maintained in an inactive state. However, as the read enable signal (RE) and the inverted read enable signal ($\overline{RE}$) are activated by transitioning to the third voltage ($V_W/2$) level and the first voltage level, respectively, the two transmission gates (TGL, TGR) of the precharge block 200 block the connection between the voltage line (VL) and the bit line pair (BL, BLB). On the other hand, in the read-write-back block, the two activation transistors (SNL, SNR) of the write-back block 420 are turned on according to the activated read enable signal (RE), and two pull-down transistors (LNL, LNR) whose gates are cross-coupled to the bit line pair (BL, BLB) remain turned on according to the third voltage ($V_W/2$) level of the precharged bit line pair (BL, BLB), so that the source line pair (SL, SLB) is connected to the ground line (GL).

In addition, the FeFET pair ($FL_1$, $FR_1$) of the selected PUF cell (CE) disposed at a position corresponding to the selected word line ($WL_0$) are turned on by the second voltage ($V_W$) applied to the gates. Since the source line pair (SL, SLB) is connected to the ground line (GL) of the first voltage level, the source line pair (SL, SLB) is discharged from the third voltage ($V_W/2$) level to the first voltage level. At this time, since the FeFET pair ($FL_1$, $FR_1$) of the selected PUF cell (CE) is turned on, the bit line pair (BL, BLB) is also connected to the ground line (GL) through the FeFET pair ($FL_1$, $FR_1$) and the source line pair (SL, SLB) and discharged. However, although the FeFET pair ($FL_1$, $FR_1$) of the selected PUF cell (CE) are all initialized to the high threshold voltage state (HVT), there is a difference in driving strength between the FeFET pair ($FL_1$, $FR_1$) due to a deviation in the manufacturing process, and thus a difference occurs in the amount of discharge current of the bit line pair (BL, BLB).

In addition, in the read-write-back block, two pull-up transistors (LPL, LPR) and two pull-down transistors (LNL, LNR) whose gates are cross-coupled to the bit line pair (BL, BLB) amplify the voltage difference between the bit line pair (BL, BLB) generated by the threshold voltage ($V_{TH}$) difference between the FeFET pair ($FL_1$, $FR_1$). That is, one of the bit line pair (BL, BLB) is discharged to the first voltage level, while the other is maintained at the third voltage ($V_W/2$) level.

At this time, more current flows through a FeFET having a relatively lower second threshold voltage ($V_{TH2}$) in the FeFET pair ($FL_1$, $FR_1$). For example, if it is assumed that, in the FeFET pair ($FL_1$, $FR_1$), the second threshold voltage ($V_{TH2}$) of the second FeFET ($FR_1$) is lower than the second threshold voltage ($V_{TH2}$) of the first FeFET ($FL_1$), the bit line bar (BLB) and the source line bar (SLB), connected to the second FeFET ($FR_1$), are discharged to a first voltage level, and the bit line (BL) and the source line (SL), connected to the first FeFET ($FL_1$), are maintained at the third voltage ($V_W/2$) level.

In the auto write-back phase, the voltage levels of each signal ($\overline{INI}$, RE, $\overline{RE}$) and each line (WL, VL, GL) are maintained at the same state as in the provisioning phase. That is, the second voltage ($V_W$) is applied to the selected word line ($WL_0$) among the plurality of word lines (WL) as it is, the first voltage level is applied to the remaining word lines, the inverted initialization signal ($\overline{INI}$) is maintained at the second voltage ($V_W$) level, and the read enable signal (RE) and the inverted read enable signal ($\overline{RE}$) are maintained at the third voltage ($V_W/2$) level and the first voltage level, respectively. In addition, the third voltage ($V_W/2$) level is applied to the voltage line (VL), and the first voltage level is applied to the ground line (GL) and maintained.

Accordingly, the two initialization transistors (INL, INR) of the initialization block 300 are maintained in an inactive state, the two activation transistors (SNL, SNR) of the write-back block 420 are activated and maintained in a state in which the source line pair (SL, SLB) and the ground line (GL) are connected, and the FeFET pair ($FL_1$, $FR_1$) of the selected PUF cell (CE) disposed at a position corresponding to the selected word line ($WL_0$) are maintained in a turned-on state.

In addition, the read-write-back block maintains the voltages of the bit line pair (BL, BLB) and the source line pair (SL, SLB) at the third voltage ($V_W/2$) level and the first voltage level.

Accordingly, a gate-source voltage ($V_G S$) corresponding to the second voltage ($V_W$) is applied between the gate and the source of the second FeFET ($FR_1$) having a relatively low second threshold voltage ($V_{TH2}$). Accordingly, the threshold voltage ($V_{TH}$) of the second FeFET ($FR_1$) changes to the first threshold voltage ($V_{TH1}$), and thus has a low threshold voltage state (LVT). That is, the second FeFET ($FR_1$) is written to the low threshold voltage state (LVT) and is stabilized.

Here, for convenience of description, the provisioning phase and the auto write-back phase were described separately, however as shown in FIG. 7, the provisioning phase and the auto write-back phase may be integrated into a provisioning and write-back phase as a phase performing the same operation. In addition, the provisioning and write-back phase, like the initialization phase, should be maintained for a pre-designated write time ($t_W$) or longer such that one of the FeFET pair ($FL_1$, $FR_1$) of the PUF cell (CE) is stably brought to the low threshold voltage state (LVT).

Therefore, in the PUF apparatus of the present embodiment, only by maintaining the state in the provisioning phase, the read-write-back block that senses and amplifies the voltage difference between the bit line pair (BL, BLB) automatically writes-back data according to the voltage difference between the bit line pair (BL, BLB) to the FeFET pair ($FL_1$, $FR_1$) of the selected PUF cell (CE), so that the states of the FeFET pair ($FL_1$, $FR_1$) of the PUF cell (CE) can be set without a separate write-back circuit.

At this time, CRP can be obtained, by acquiring the address of the selected word line (WL) as a challenge, and sensing the response of the voltage difference between the bit line pair (BL, BLB) or the source line pair (SL, SLB) generated by the PUF cell (CE) corresponding to the selected word line (WL).

Although in the provisioning phase and auto write-back phase, current consumption may increase due to a current path formed from the voltage line (VL) to the bit line pair (BL, BLB), the source line pair (SL, SLB) and the ground line (GL), since as described above, the enrollment phase is initially performed at the authentication server side once, the increase in the current consumption is not a problem.

In addition, in the enrollment phase, different word lines may be selected while repeatedly executing from the precharge phase to the auto write-back phase a number of times corresponding to the number of word lines, such that the authentication server can obtain all CRPs of the PUF apparatus by identifying the responses to all challenges.

Figure 8:
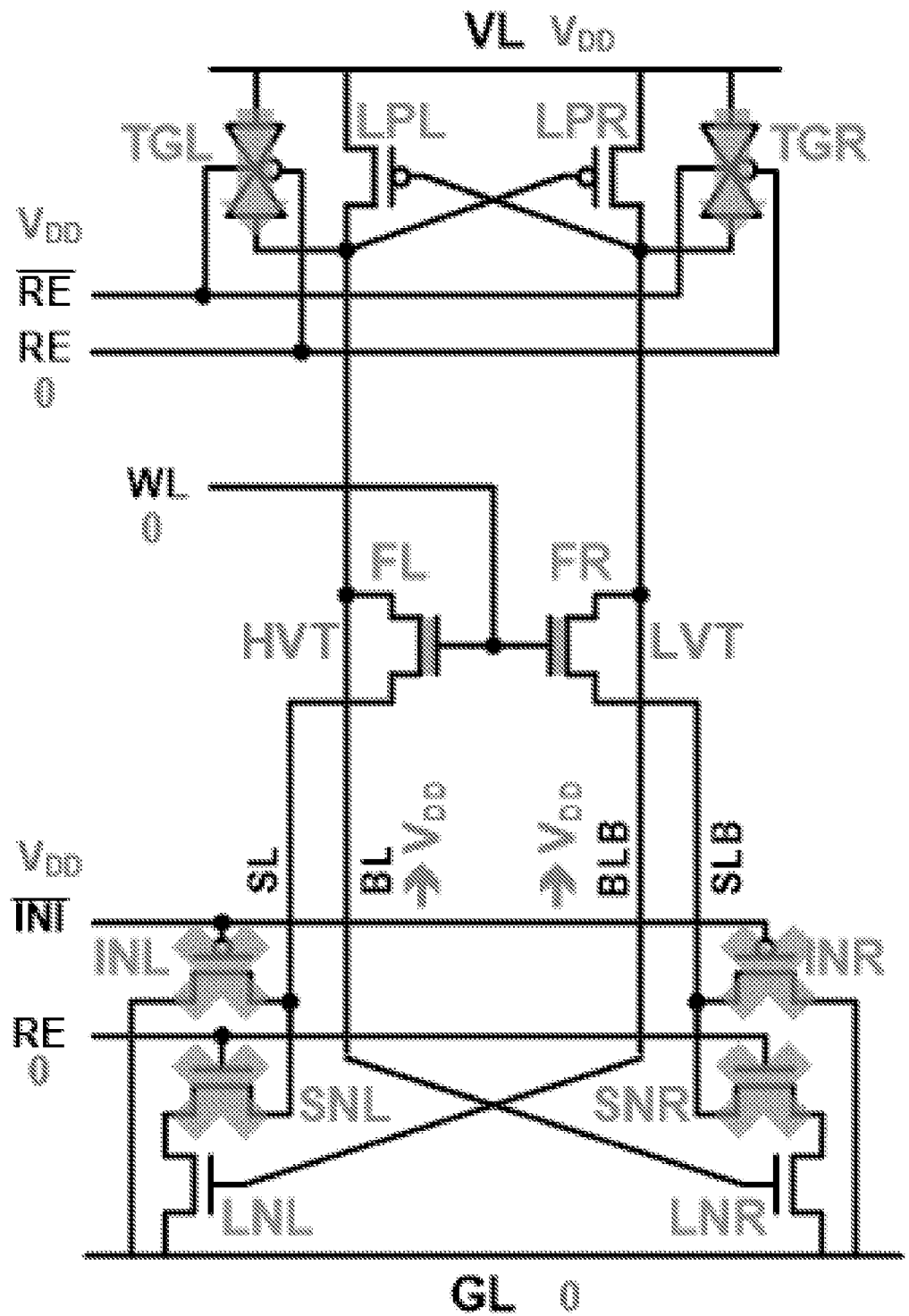
FIGS. 8 and 9 are diagrams for explaining operations of an evaluation phase of the PUF apparatus according to the present embodiment.
Figure 9:
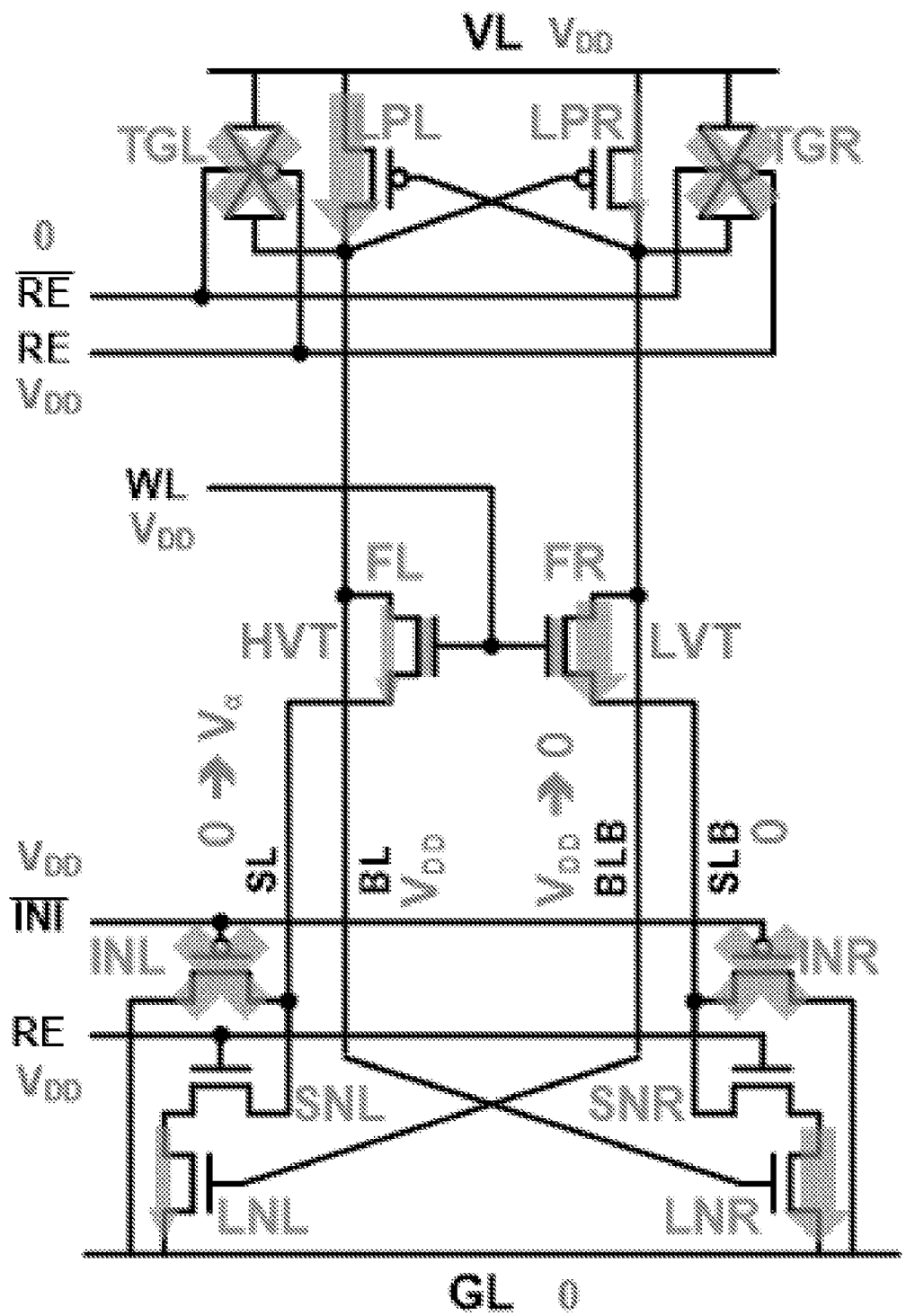
Figure 10:
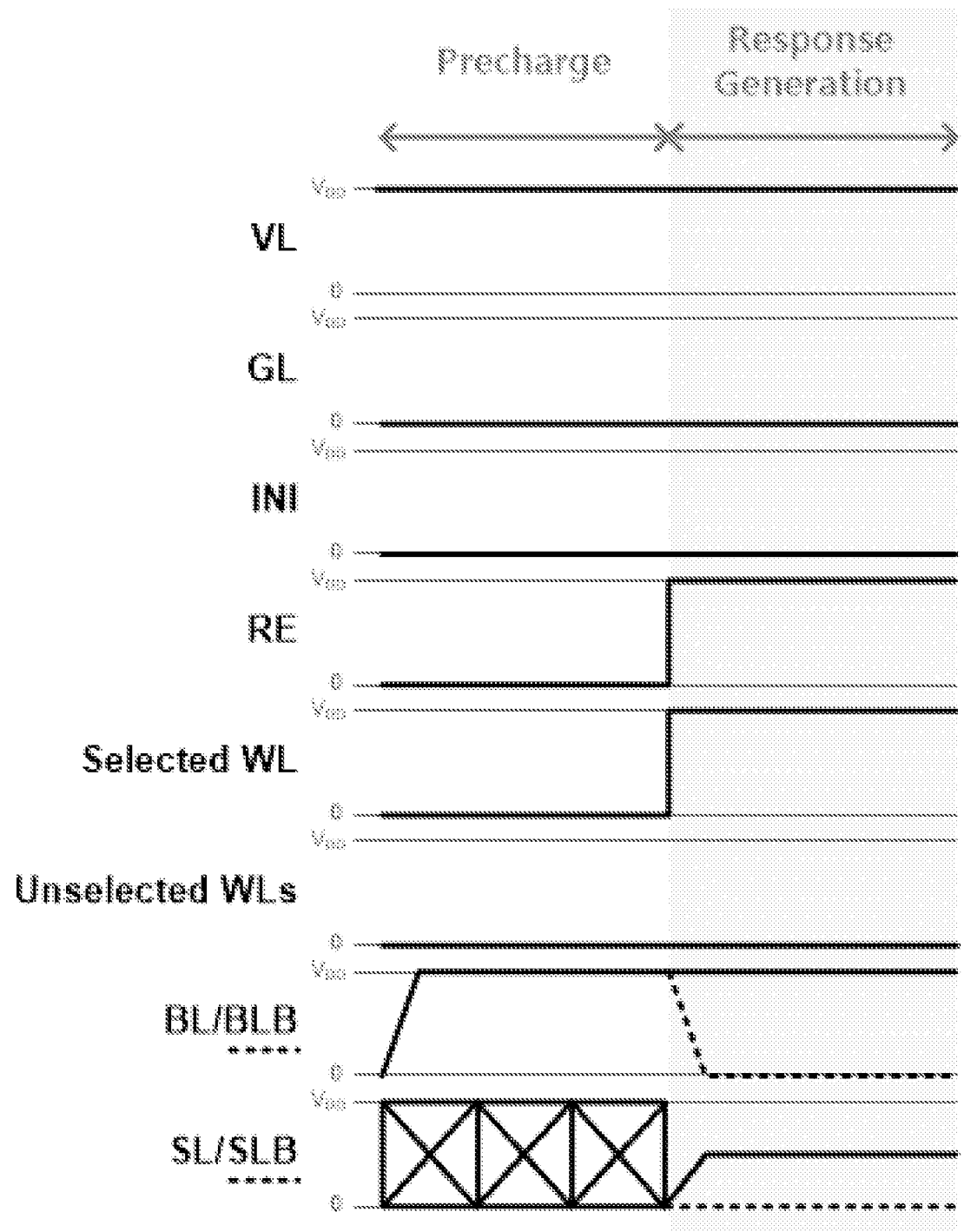
FIG. 10 shows a timing diagram for the evaluation phase shown in FIGS. 8 and 9.

FIGS. 8 and 9 are diagrams for explaining operations of an evaluation phase of the PUF apparatus according to the present embodiment, and FIG. 10 shows a timing diagram for the evaluation phase shown in FIGS. 8 and 9.

The evaluation phase of the PUF apparatus can be divided into detailed phases of a precharge phase shown in FIG. 8 and a response generation phase shown in FIG. 9. Hereinafter, in order to distinguish the precharge phase of the evaluation phase from the precharge phase of the enrollment phase, the precharge phase of the enrollment phase is referred to as an enrollment precharge phase, and the precharge phase of the evaluation phase is referred to as an evaluation precharge phase.

Referring to FIG. 8 and FIG. 10, in the evaluation precharge phase, all of the plurality of word lines (WL) are inactivated by applying the first voltage level thereto. In addition, a pre-designated fourth voltage ($V_{DD}$) is applied to the voltage line (VL), and the first voltage level is applied to the ground line (GL). Meanwhile, the read enable signal (RE) is inactivated to the first voltage level, and the inverted read enable signal ($\overline{RE}$) and the inverted initialization signal ($\overline{INI}$) are inactivated to the fourth voltage ($V_{DD}$) level.

Accordingly, since the plurality of word lines (WL) are inactivated to the first voltage level, the first voltage level is applied to the gates of the FeFET pair (FL, FR) of the PUF cell (CE) and to maintain a turned-off state. In addition, the precharge block 200 is activated by the read enable signal pair (RE, $\overline{RE}$), and applies the fourth voltage ($V_{DD}$) applied to the voltage line (VL) to the bit line pair (BL, BLB) to precharge. Here, the fourth voltage ($V_{DD}$) may have a voltage level (here, 1V as an example) between the first threshold voltage ($V_{TH1}$) and the second threshold voltage ($V_{TH2}$) of the FeFET pair (FL, FR) of the PUF cell (CE).

The two initialization transistors (INL, INR) of the initialization block 300 are inactivated by the inverted initialization signal ($\overline{INI}$), and the two activation transistors (SNL, SNR) of the write-back block 420 are inactivated by the read enable signal (RE), so that the connection between the source line pair (SL, SLB) and the ground line (GL) is cut off. In addition, the two pull-up transistors (LPL, LPR) in the amplifying block 410 of the read-write-back block are turned-off by the bit line pair (BL, BLB) precharged to the fourth voltage ($V_{DD}$) level.

Referring to FIG. 9 and FIG. 10, in the response generation phase, one word line (here, $WL_0$ as an example) may be selected among a plurality of word lines according to a challenge applied by the authentication server, a fourth voltage ($V_{DD}$) is applied to the selected word line ($WL_0$) and a first voltage level is applied to the remaining word lines. In addition, the inverted initialization signal ($\overline{INI}$) is maintained in an inactive state with the level of the fourth voltage ($V_{DD}$), while the read enable signal (RE) and the inverted read enable signal ($\overline{RE}$) are activated to the fourth voltage ($V_{DD}$) level and the first voltage level, respectively.

As the inverted initialization signal ($\overline{INI}$) is maintained at the fourth voltage ($V_{DD}$) level, the two initialization transistors (INL, INR) of the initialization block 300 are maintained in an inactive state, however as the read enable signal (RE) transitions to the fourth voltage ($V_{DD}$) level, the two transmission gates (TGL, TGR) of the precharge block 200 block the connection between the voltage line (VL) and the bit line pair (BL, BLB). In addition, the two activation transistors (SNL, SNR) of the write-back block 420 are activated, and accordingly connect the source line pair (SL, SLB) and the ground line (GL).

In the FeFET pair ($FL_1$, $FR_1$) of the PUF cell (CE) corresponding to the selected word line ($WL_0$), already by the provisioning and write-back phase of the enrollment phase, one has a high threshold voltage state (HVT), while the other has a low threshold voltage state (LVT). Accordingly, current flows through only one of the FeFET pair ($FL_1$, $FR_1$) by the difference in the threshold voltage state. In particular, since the FeFET has a high on/off ratio of $10^{15}$ level as described above, no current flows through the first FeFET ($FL_1$) having a high threshold voltage state (HVT).

Accordingly, current flows only through the second FeFET ($FR_1$) having the low threshold voltage state (LVT), the voltage levels of the bit line bar (BLB) and the source line bar (SLB) drop to the first voltage level, and in the read-write-back block, two pull-up transistors (LPL, LPR) and two pull-down transistors (LNL, LNR) whose gates are cross-coupled to the bit line pair (BL, BLB) amplify the voltage difference between the bit line pair (BL, BLB) generated by the state difference between the FeFET pair ($FL_1$, $FR_1$) such that it occurs faster.

Accordingly, by sensing the voltages of the bit line pair (BL, BLB) or the source line pair (SL, SLB), the response of the selected PUF cell (CE) can be checked. In addition, the PUF apparatus may transmit a response identified in response to a challenge applied from the authentication server to the authentication server, so that the authentication server can perform authentication for the PUF apparatus.

Since the above-described PUF apparatus based on ferroelectric elements may be implemented only with two FeFETs, each of which is a PUF cell (CE), which is a non-volatile memory, it can be implemented with a small size and can have high stability. In addition, since a separate write-back circuit is not required, it can be implemented in a smaller size, and since, due to the high on/off ratio of the FeFET, almost no static current occurs through the FeFET having a high threshold voltage state (HVT) among the two FeFETs of the PUF cell (CE), power consumption can be reduced.

Figure 11:
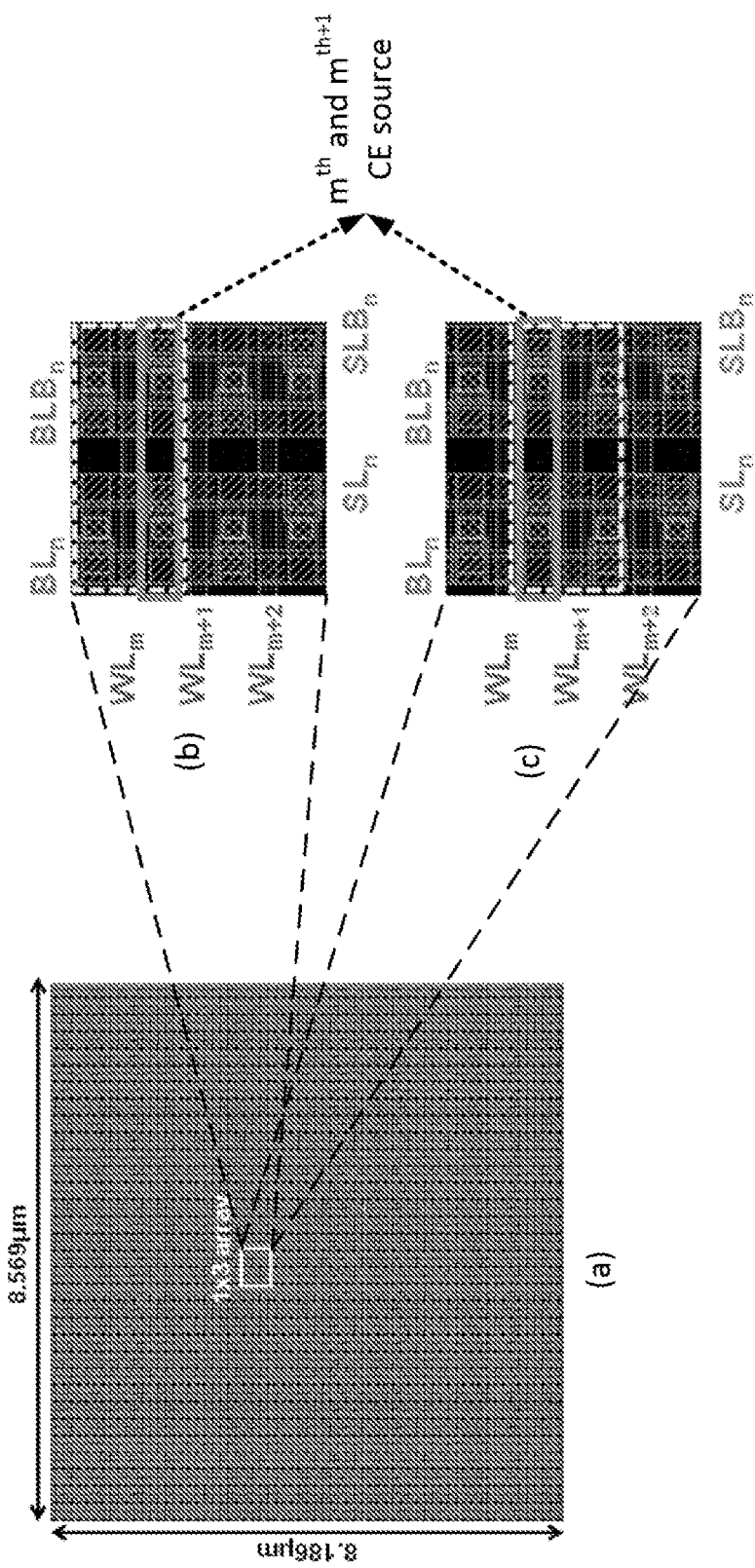
FIG. 11 shows an example of a chip layout of the PUF apparatus according to the present embodiment.

FIG. 11 shows an example of a chip layout of the PUF apparatus according to the present embodiment.

In FIGS. 1 to 9, in a plurality of PUF cells (CE) arranged in a matrix form, each FeFET pair (FL, FR) is shown to be arranged in the same form. Here, it can be seen that in a plurality of PUF cells (CE) arranged in the same column among a plurality of PUF cells (CE) arranged in a matrix form, in the first FeFET (FL={$FL_1$, $FL_2$, $FL_3$, ... }), drains and sources are commonly connected to a bit line (BL) and a source line (SL), and in the second FeFET (FR={$FR_1$, $FR_2$, $FR_3$, ... }), drains and sources are commonly connected to a bit line bar (BLB) and a source line bar (SLB). This means that, among a plurality of first FeFETs (FL) of a plurality of PUF cells (CE) disposed in the same column, sources or drains of first FeFETs adjacent to each other may be designed to be shared, and among a plurality of second FeFETs (FR), sources or drains of second FeFETs adjacent to each other may be designed to be shared.

In FIG. 11, (a) shows an overall chip design layout of the PUF apparatus, and (b) and (c) are enlarged views of the layout of three PUF cells (CE) of 1×3 array size indicated by a rectangle in (a).

Here, in (b), the area of the PUF cell (CE) corresponding to the m-th word line ($WL_m$) among the three PUF cells (CE) is indicated by a white rectangular dotted line, and in (c), the area of the PUF cell (CE) corresponding to the (m+1)th word line ($WL_{m+1}$) is indicated by a white rectangular dotted line.

As shown in (b) and (c), sources of first FeFETs ($FL_m$, $FL_{m+1}$) and second FeFETs ($FR_m$, $FR_{m+1}$) of the PUF cells (CE) corresponding to the m-th and (m+1)th word lines ($WL_m$, $WL_{m+1}$) disposed adjacent to each other may be designed to be used in common. Similarly, drains of first FeFETs ($FL_{m+1}$, $FL_{m+2}$) and second FeFETs ($FR_{m+1}$, $FR_{m+2}$) of the PUF cells (CE) corresponding to the (m+1)th and (m+2)th word lines ($WL_{m+1}$, $WL_{m+2}$) disposed adjacent to each other may be designed to be used in common.

In this case, the size of the PUF cell (CE) can be significantly reduced, compared to a case where sources and drains are individually implemented for each PUF cell (CE). According to the layout design simulation results, it was confirmed that when designing by applying this method, the area required to implement each PUF cell (CE) can be reduced by 48% or more, compared to a case where this method is not applied.

Figure 12:
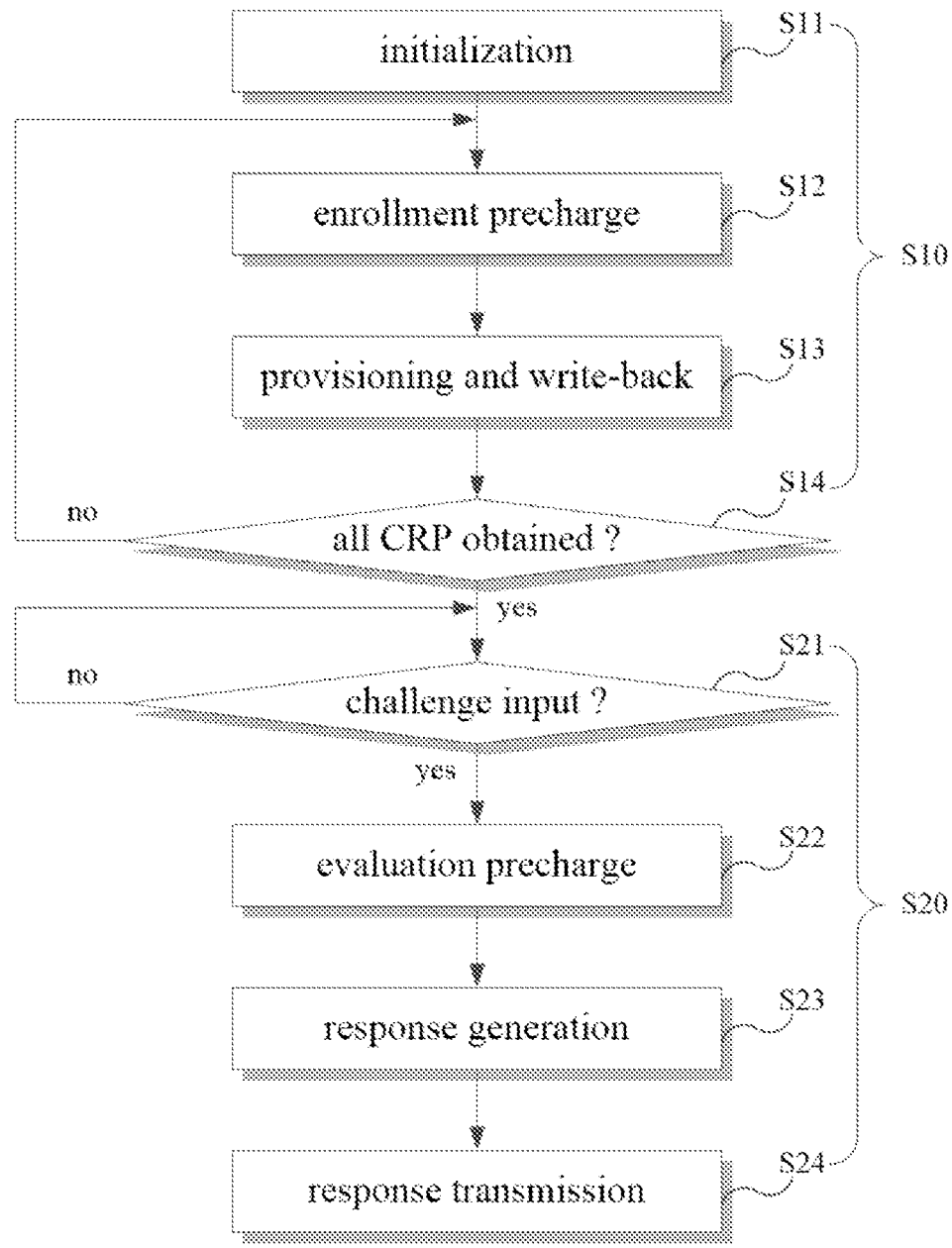
FIG. 12 shows a PUF operation method according to an embodiment of the present disclosure.

FIG. 12 shows a PUF operation method according to an embodiment of the present disclosure.

The PUF operation according to the present embodiment is performed in a PUF apparatus, including a PUF cell array 100 in which a plurality of PUF cells (CE) are arranged which are defined by a plurality of word lines (WL), and a plurality of bit line pairs (BL, BLB) and a plurality of source line pairs (SL, SLB) running in a direction crossing the plurality of word lines (WL), each PUF cell (CE) comprising a FeFET pair (FL, FR) which are ferroelectric elements.

The FeFET pair (FL, FR) of the plurality of PUF cells (CE) has gates commonly connected to a corresponding word line, drains respectively connected to a bit line (BL) and a bit line bar (BLB) of a corresponding bit line pair (BL, BLB), and sources respectively connected to a source line (SL) and a source line bar (SLB) of a corresponding source line pair (SL, SLB).

The PUF operation method may comprise an enrollment phase (S10) for obtaining CRP by obtaining a response output according to the state of the FeFET pair (FL, FR) included in the PUF cell (CE) of each address for a challenge indicating the address of the PUF cell (CE) in the PUF cell array 100 of the PUF apparatus, and an evaluation phase (S20) of submitting a response corresponding to the challenge applied based on the CRP obtained in the enrollment phase (S10).

In the enrollment phase (S10), first, the FeFET pair (FL, FR) is inactivated, by applying a first voltage of a pre-designated voltage level (e.g., 0V) to the gates of the FeFET pairs (FL, FR) of all the PUF cells (CE) through the plurality of word lines (WL), and the FeFET pairs (FL, FR) of all PUF cells (CE) are initialized to have a high threshold voltage state (HVT) by applying a second voltage ($V_W$) of a pre-designated voltage level to the plurality of bit line pairs (BL, BLB) and the plurality of source line pairs (SL, SLB) for a pre-designated write time ($t_W$) or longer (S11).

At this time, a second voltage ($V_W$) is applied to each of the plurality of bit line pairs (BL, BLB) through a corresponding column precharge block among a plurality of column precharge blocks, each including two transmission gates (TGL, TGR) which are connected between the voltage line (VL) to which the second voltage ($V_W$) is applied and each of the plurality of bit line pairs (BL, BLB), and activated according to the inactivated read enable signal and the activated inverted read enable signal, that is, the read enable signal pair (RE, $\overline{RE}$).

In addition, a second voltage ($V_W$) is applied to each of the plurality of source line pairs (SL, SLB) through a corresponding column initialization block among a plurality of column initialization blocks, including two initialization transistors (INL, INR) which are connected between the ground line (GL) to which the second voltage ($V_W$) is applied and each of the plurality of source line pairs (SL, SLB), and to the gates of which the inverted initialization signal ($\overline{INI}$) is applied.

When all of the FeFET pairs (FL, FR) of the plurality of PUF cells (CE) of the PUF cell array 100 are initialized to the high threshold voltage state (HVT), an enrollment precharge phase is performed in which a plurality of source line pairs (SL, SLB) are floated, and a third voltage ($V_W/2$) is applied to a plurality of bit line pairs (BL, BLB), so that the plurality of bit line pairs (BL, BLB) are precharged to the third voltage ($V_W/2$) (S12). Here, the third voltage ($V_W/2$) may have a voltage level corresponding to a half voltage of the voltage difference between the first voltage and the second voltage ($V_W$).

In the enrollment precharge phase, the precharge block 200 is activated according to the read enable signal pair (RE, $\overline{INI}$), and accordingly transmits the third voltage ($V_W/2$) applied to the voltage line (VL) to the plurality of bit line pairs (BL, BLB), thereby precharging the plurality of bit line pairs (BL, BLB) to the third voltage ($V_W/2$). At this time, the initialization block 300 blocks the connections between the plurality of source line pairs (SL, SLB) and the ground line (GL) according to the inverted initialization signal ($\overline{INI}$), thereby floating the plurality of source line pairs (SL, SLB). Meanwhile, the read-write-back block does not perform a separate operation by the plurality of bit line pairs (BL, BLB) precharged to the third voltage ($V_W/2$) and the floated plurality of source line pairs (SL, SLB).

When the plurality of bit line pairs (BL, BLB) are precharged to the third voltage ($V_W/2$), one word line is selected from among the plurality of word lines (WL), a second voltage ($V_W$) is applied to the selected word line, and a first voltage is applied to the other word lines. Accordingly, the FeFET pairs (FL, FR) of the PUF cells (CE) connected to the selected word line are turned-on.

At this time, the plurality of bit line pairs (BL, BLB) are disconnected from the voltage line (VL) by the precharge block 200 that is inactivated according to the read enable signal pair (RE, $\overline{RE}$), and the plurality of source line pairs (SL, SLB) are connected to the ground line (GL) by a plurality of activation transistors (SNL, SNR) of the write-back block 420 turned-on according to the read enable signal (RE) and a plurality of pull-down transistors (LNL, LNR) whose gates are cross-coupled to the corresponding bit line pair (BL, BLB).

When a plurality of source line pairs (SL, SLB) are connected to the ground line (GL), a voltage drop occurs in the precharged bit line pairs (BL, BLB) through the FeFET pairs (FL, FR) of the PUF cells (CE) connected to the selected word line among the plurality of PUF cells (CE). However, by sensing the voltage difference between the bit line pair (BL, BLB) generated due to a difference in driving strength between the FeFET pair ($FL_1$, $FR_1$) of the selected PUF cell (CE) due to a deviation in the manufacturing process by means of a corresponding first sense amplifier and a second sense amplifier, amplifying it to a third voltage ($V_W/2$) and a first voltage, and maintaining the amplified voltage difference between the bit line pair (BL, BLB) for a pre-designated write time ($t_W$), and accordingly transitioning one of the FeFET pair ($FL_1$, $FR_1$) of the selected PUF cell (CE) to the low threshold voltage state (LVT), a provisioning and write-back phase of setting the response of the selected PUF cell (CE) is performed (S13).

When the provisioning and write-back phase is performed, addresses for all PUF cells (CE) of the PUF cell array 100 are selected as challenges, and it is determined whether the states of the FeFET pair ($FL_1$, $FR_1$) of the selected PUF cell (CE) is settled according to the selected challenges and accordingly responses have been obtained. That is, it is determined whether all the challenge-response pairs (CRP) have been obtained (S14). If it is determined that all CRPs have not been obtained, the enrollment precharge phase (S12) is performed again so that the bit line pairs (BL, BLB) are precharged to the third voltage ($V_W/2$), and a provisioning and write-back phase is performed by selecting another word line (WL) that has not been previously selected (S13).

However, if it is determined that all CRPs have been obtained, the obtained CRPs are stored in the authentication server. Then, the PUF apparatus for which the CRPs have been obtained is applied to each device requiring security authentication, such as an IoT device.

Thereafter, the PUF apparatus determines whether a challenge corresponding to the address of the PUF cell (CE) is input from the authentication server (S21).

If a challenge is input, an evaluation precharge phase is performed in which the bit line pair (BL, BLB) are precharged to a fourth voltage level ($V_{DD}$) having a voltage level between the first threshold voltage ($V_{TH1}$) and the second threshold voltage ($V_{TH2}$) of the FeFET pair (FL, FR) of the PUF cell (CE) (S22). In the evaluation precharge phase, as in the enrollment precharge phase, the precharge block 200 activated according to the read enable signal pair (RE, $\overline{RE}$) transmits the voltage applied to the voltage line (VL) to a plurality of bit line pairs (BL, BLB), thereby precharging the plurality of bit line pairs (BL, BLB). However, in the evaluation precharge phase, unlike in the enrollment precharge phase, as the fourth voltage ($V_{DD}$) is applied to the voltage line VL, the plurality of bit line pairs (BL, BLB) are precharged to the fourth voltage ($V_{DD}$) level.

Then, one word line from among a plurality of word lines (WL) is selected according to the applied challenge, a fourth voltage ($V_{DD}$) is applied to the selected word line ($WL_0$), a first voltage is applied to the remaining word lines, and, by sensing the voltage difference between the bit line pair (BL, BLB) generated due to a difference in driving strength according to the set state of the FeFET pair ($FL_1$, $FR_1$) of the selected PUF cell (CE) by means of a corresponding first sense amplifier and a second sense amplifier, and amplifying it to the fourth voltage ($V_{DD}$) and the first voltage, a response of the selected PUF cell (CE) is generated (S23).

Here, the phase of generating a response is performed the same as in the provisioning and write-back phase, except that the second voltage ($V_W$) or the third voltage ($V_W/2$) is replaced with the fourth voltage ($V_{DD}$).

Then, the generated response is transmitted to the authentication server that transmitted the challenge, and the authentication server authenticates the PUF apparatus by verifying the response based on the previously obtained and stored CRP (S24).

While the present disclosure is described with reference to embodiments illustrated in the drawings, these are provided as examples only, and the person having ordinary skill in the art would understand that many variations and other equivalent embodiments can be derived from the embodiments described herein.

Therefore, the true technical scope of the present disclosure is to be defined by the technical spirit set forth in the appended scope of claims.

What is claimed is:

1. A PUF apparatus comprising:
   a PUF cell array in which a plurality of PUF cells are arranged each including a FeFET pair whose gates are commonly connected to a corresponding word line among a plurality of word lines, and whose drains and sources are respectively connected to a corresponding bit line pair and a corresponding source line pair among a plurality of bit line pairs and a plurality of source line pairs running in a direction crossing the plurality of word lines; and
   a read-write-back block which is activated according to a read enable signal, and senses and amplifies a voltage difference occurring in a corresponding bit line pair among the plurality of bit line pairs according to the difference in driving strength due to a deviation in a manufacturing process of the FeFET pair included in a PUF cell selected by a selected word line among the plurality of word lines,
   wherein the read-write-back block includes:
   an amplifying block having a plurality of first sense amplifiers which are disposed between the plurality of bit line pairs and a voltage line, respectively, and which cross-sense the corresponding bit line pair and amplify the voltage difference between the corresponding bit line pair; and
   a write-back block having a plurality of second sense amplifiers which are disposed between the plurality of source line pairs and a ground line, respectively, and which are activated according to the read enable signal, cross-sense the corresponding bit line pair and generate a voltage difference in the corresponding source line pair.

2. The PUF apparatus according to claim 1,
   wherein each of the plurality of first sense amplifiers includes:
   a first pull-up transistor which is connected between a bit line of a corresponding bit line pair and the voltage line, and a gate of which is connected to a bit line bar; and
   a second pull-up transistor which is connected between a bit line bar of a corresponding bit line pair and the voltage line, and a gate of which is connected to a bit line.

3. The PUF apparatus according to claim 1,
   wherein each of the plurality of second sense amplifiers includes:
   a first activation transistor, one end of which is connected to a source line of a corresponding source line pair, and having a gate to which the read enable signal is applied;
   a second activation transistor, one end of which is connected to a source line bar of a corresponding source line pair, and having a gate to which the read enable signal is applied;
   a first pull-down transistor, which is connected between the other end of the first activation transistor and the ground line, and having a gate to which a bit line bar of a corresponding bit line pair is connected; and a second pull-down transistor, which is connected between the other end of the second activation transistor and the ground line, and having a gate to which a bit line of a corresponding bit line pair is connected.

4. The PUF apparatus according to claim 1, wherein the PUF apparatus further includes:

a precharge block having a plurality of column precharge blocks which are connected in parallel to a corresponding first sense amplifier between a corresponding bit line pair among the plurality of bit line pairs and the voltage line, and which supply a voltage applied to the voltage line to a corresponding bit line pair according to an inactivated read enable signal; and an initialization block having a plurality of column initialization blocks which are connected in parallel with a corresponding second sense amplifier between a corresponding source line pair among the plurality of source line pairs and the ground line, and which supply a voltage applied to the ground line to a corresponding source line pair according to an inactivated inverted initialization signal.

5. The PUF apparatus according to claim 4, wherein each of the plurality of column precharge blocks includes:

a first transmission gate which is connected between a bit line of a corresponding bit line pair and the voltage line, and which supplies the voltage of the voltage line to the bit line, according to the inactivated read enable signal and an inverted read enable signal in which the read enable signal is inverted; and a second transmission gate which is connected between a bit line bar of a corresponding bit line pair and the voltage line, and which supplies the voltage of the voltage line to the bit line bar, according to the inactivated read enable signal and the inverted read enable signal.

6. The PUF apparatus according to claim 4, wherein each of the plurality of column initialization blocks includes:

a first initialization transistor which is connected between a source line of a corresponding source line pair and the ground line, and which supplies the voltage of the ground line to the source line according to the inactivated inverted initialization signal; and a second initialization transistor which is connected between a source line bar of a corresponding source line pair and the ground line, and which supplies the voltage of the ground line to the source line bar according to the inactivated inverted initialization signal.

7. The PUF apparatus according to claim 4, wherein the voltage line allows the FeFET pair of each of the plurality of PUF cells to have different threshold voltage states according to variations in the manufacturing process, such that among an initialization phase, an enrollment precharge phase and a provisioning and write-back phase of an enrollment phase of setting a response corresponding to a challenge indicating an address of each PUF cell, in the initialization phase it has a second voltage, and in the enrollment precharge phase and the provisioning and write-back phase it has a third voltage, wherein the ground line has a first voltage in the initialization phase, and has the third voltage in the enrollment precharge phase and the provisioning and write-back phase, wherein the selected word line among the plurality of word lines has the first voltage in the initialization phase and the enrollment precharge phase, and has the second voltage in the provisioning and write-back phase, and wherein unselected word lines among the plurality of word lines have the first voltage in the initialization phase and the enrollment precharge phase, and have the third voltage in the provisioning and write-back phase.

8. The PUF apparatus according to claim 7, wherein the initialization block is activated in the initialization phase and accordingly applies the second voltage applied to the ground line to the source line pair, and wherein the precharge block applies the second voltage applied to the voltage line in the initialization phase to the bit line pair, and applies a third voltage applied to the voltage line in the enrollment precharge phase after the initialization phase to the bit line pair.

9. The PUF apparatus according to claim 8, wherein the initialization phase and the provisioning and write-back phase have a time interval greater than or equal to a pre-designated write time such that the FeFET pair of the PUF cell corresponding to the selected word line has a high threshold voltage state or a low threshold voltage state according to a gate-source voltage, respectively.

10. The PUF apparatus according to claim 8, wherein the voltage line has a fourth voltage in an evaluation phase in which a FeFET pair of a PUF cell selected according to an address applied as a challenge among the plurality of PUF cells generates and outputs a response according to different threshold voltage states set in the enrollment phase, wherein the ground line has the first voltage in the evaluation phase, wherein, among an evaluation precharge phase and a response generation phase of the evaluation phase, in the evaluation precharge phase, the selected word line among the plurality of word lines has the first voltage, and in the response generation phase, has the fourth voltage, and wherein the unselected word lines among the plurality of word lines have the first voltage in the evaluation phase.

11. The PUF apparatus according to claim 10, wherein the initialization block is inactivated in the evaluation phase, and wherein the precharge block is activated in the evaluation precharge phase and accordingly applies the fourth voltage applied to the voltage line to the bit line pair.

* * * * *